United States Patent
Watanabe (10) Patent No.: US 11,482,858 B2
(45) Date of Patent: Oct. 25, 2022

(54) PROTECTION CIRCUIT

(71) Applicants: Kabushiki Kaisha Toshiba, Tokyo (JP); Toshiba Electronic Devices & Storage Corporation, Tokyo (JP)

(72) Inventor: Kentaro Watanabe, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 342 days.

(21) Appl. No.: 16/786,112

(22) Filed: Feb. 10, 2020

(65) Prior Publication Data

US 2021/0083471 A1  Mar. 18, 2021

(30) Foreign Application Priority Data

Sep. 13, 2019 (JP) .............................. JP2019-167172

(51) Int. Cl.
*H02H 9/04* (2006.01)
*H02H 7/122* (2006.01)
*H01L 27/02* (2006.01)

(52) U.S. Cl.
CPC ......... *H02H 9/046* (2013.01); *H01L 27/0266* (2013.01); *H01L 27/0292* (2013.01); *H02H 7/122* (2013.01)

(58) Field of Classification Search
CPC .... H02H 9/046; H02H 7/122; H01L 27/0266; H01L 27/0292; H01L 27/0285
See application file for complete search history.

(56) References Cited

U.S. PATENT DOCUMENTS

| 7,724,485 B2 | 5/2010 | Worley et al. | |
| 2007/0109698 A1* | 5/2007 | Kim | H01L 27/0285 361/56 |
| 2008/0291591 A1* | 11/2008 | Huang | H01Q 1/50 361/56 |
| 2014/0029144 A1 | 1/2014 | Kaku | |
| 2014/0368958 A1 | 12/2014 | Ikimura | |
| 2016/0268798 A1* | 9/2016 | Haruki | H02H 9/046 |
| 2018/0097357 A1* | 4/2018 | Di Sarro | H01L 27/0266 |

FOREIGN PATENT DOCUMENTS

| JP | 5074500 B2 | 11/2012 |
| JP | 2014-26996 A | 2/2014 |
| JP | 2015-2510 A | 1/2015 |

\* cited by examiner

*Primary Examiner* — Adolf D Berhane
*Assistant Examiner* — Afework S Demisse
(74) *Attorney, Agent, or Firm* — Allen & Overy LLP (57) ABSTRACT

In general, according to one embodiment, a protection circuit includes first and second power lines, first and second controllers, a first transistor, and a detector. The first controller includes a first resistor element, a capacitor, first, second, and third inverters. The second controller includes third transistor. One end of the third transistor is coupled to the second power line. The other end of the third transistor is coupled to each of the output end of the first inverter and the input end of the second inverter.

14 Claims, 8 Drawing Sheets

| State | First | Second |
|---|---|---|
| Voltage of power line PW | 0V | 5.5V |
| State of transistor 24 | Off | Off |
| Voltage of node N3 | 0V | 0V |
| Logic level of node N3 | ✕ | L |
| Logic level of node N4 | ✕ | H |
| State of transistor 40 | Off | On |

| State | First | Second | Third | Fourth |
|---|---|---|---|---|
| Voltage of power line PW | 5V | 7.5V | 10.5V | 11V |
| State of transistor 24 | Off | On | On | On |
| Voltage of node N3 | 5V | 5V | 5V | 5V |
| Logic level of node N3 | H | H | L | L |
| Logic level of node N4 | L | L | L | L |
| State of transistor 40 | Off | Off | Off | Off |
| State of external protection device PD | Off | Off | Off | On |

PROTECTION CIRCUIT

CROSS-REFERENCE TO RELATED APPLICATIONS

This application is based upon and claims the benefit of priority from Japanese Patent Application No. 2019-167172, filed Sep. 13, 2019, the entire contents of which are incorporated herein by reference.

FIELD

Embodiments described herein relate generally to a protection circuit.

BACKGROUND

A protection circuit for Electro Static Discharge (ESD) is known. An ESD is a static discharge in which a large electric current flows instantaneously between two objects of different potentials. When the ESD occurs, an electric current flows into an object with low potential, causing the voltage of a node into which the electric current has flowed to suddenly rise. The protection circuit functions as an electric current path when the ESD has occurred, and limits the voltage from rising by discharging the electric current of the ESD via the electric current path.

As a state in which the ESD occurs, for example, a device level and a system level may be considered. In order to discharge the ESD of the system level, a protection device is provided in a system.

DETAILED DESCRIPTION

In general, according to one embodiment, a protection circuit includes a first power line, a second power line, a first controller, a first transistor, a detector, and a second controller. The first controller includes a first resistor element, a capacitor, a first inverter, a second inverter, and a third inverter. One end of the first resistor element is coupled to the first power line. One electrode of the capacitor is coupled to the second power line. An input end of the first inverter is coupled to each of the other end of the first resistor element and the other electrode of the capacitor. An input end of the second inverter is coupled to an output end of the first inverter. An input end of the third inverter is coupled to an output end of the second inverter. A gate of the first transistor is coupled to an output end of the third inverter. One end of the first transistor is coupled to the first power line. The other end of the first transistor is coupled to the second power line. The detector includes a diode string and a second resistor element. The diode string that includes a plurality of diodes coupled in series. An anode of each of the diodes are coupled on the first power line side. An anode side end of the diode string is coupled to the first power line. One end of the second resistor is coupled to the second power line. The other end of the second resistor is coupled to a cathode side end of the diode string. The second controller includes a second transistor, a third resistor element, a fourth inverter, and a third transistor. A gate of the second transistor is coupled to each of the cathode side end of the diode string and the other end of the second resistor element. One end of the second transistor is coupled to the second power line. One end of the third resistor element is coupled to the first power line. An input end of the fourth inverter is coupled to each of the other end of the second transistor and the other end of the third resistor. A gate of the third transistor is coupled to an output end of the fourth inverter. One end of the third transistor is coupled to the second power line. The other end of the third transistor is coupled to each of the output end of the first inverter and the input end of the second inverter.

Hereinafter, embodiments will be described with reference to the accompanying drawings. Each of the embodiments is an example of an apparatus and a method to embody a technical idea of the invention. The drawings are schematic or conceptual, and the dimensions and ratios, etc. in the drawings are not always the same as the actual ones. The technical ideas of the present invention are not limited by shapes, structures, or arrangements, etc. of the components.

In the description that follows, components having substantially the same functions and configurations will be denoted by the same reference symbols. The numbers after the letters constituting the reference symbols are used to discriminate between components that are denoted by the reference symbols sharing letters in common and that have similar configurations. If there is no need to discriminate between components that are denoted by the reference symbols sharing letters in common, such components are denoted by reference symbols that include the letters only.

Embodiment

Hereinafter, a protection circuit 1 according to an embodiment will be explained. The protection circuit 1 according to the embodiment is a protection circuit related to an ESD of a device level and an ESD of a system level. The ESD of the device level is an ESD with respect to a stand-alone device such as an LSI chip. The ESD of the device level is discharged via the protection circuit 1 included in the device. The ESD of the system level is an ESD with respect to a system on which a plurality of LSI chips, etc. are mounted, and on which a power-supply voltage is applied and the system is operated. In the ESD of the system level, a load with respect to the electric current path is larger than that in the ESD of the device level. Therefore, a protection device is provided in the system to discharge the ESD of the system level.

[1] Configuration of Protection Circuit 1

[1-1] Entire Configuration of Integrated Circuit Device IC Including Protection Circuit 1

Figure 1:
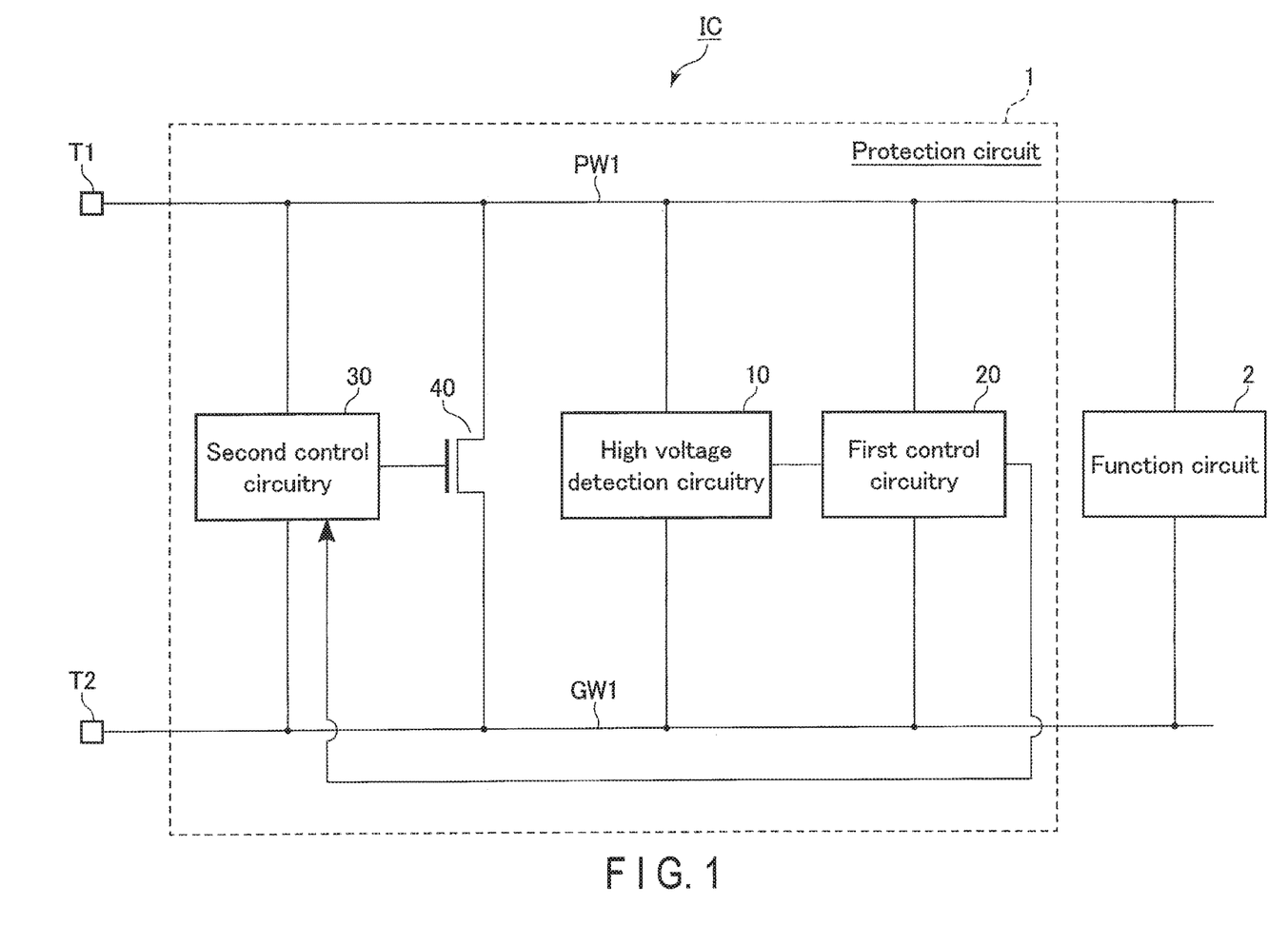
FIG. 1 is a block diagram showing a configuration example of an integrated circuit device including a protection circuit according to an embodiment.

FIG. 1 shows a configuration example of an integrated circuit device IC including the protection circuit 1 according to the embodiment. As shown in FIG. 1, the integrated circuit device IC comprises power lines PW1 and GW1, terminals T1 and T2, the protection circuit 1, and a function circuit 2.

Each of the power lines PW1 and GW1 is used to supply power-supply voltage to each circuitry included in the integrated circuit device IC. Each of the terminals T1 and T2 is configured in a connectible manner with an external device of the integrated circuit device IC. The terminal T1 is a positive-side power-supply terminal of the integrated circuit device IC, and is coupled to the power line PW1. A power-supply voltage Vdd, for example, is applied to the terminal T1. The terminal T2 is a negative-side power-supply terminal of the integrated circuit device IC, and is coupled to the power line GW1. A power-supply voltage Vss, which is lower than the power-supply voltage Vdd, for example, is applied to the terminal T2.

The protection circuit 1 and the function circuit 2 are, for example, integrated on a single semiconductor chip. The protection circuit 1 is coupled to each of the power lines PW1 and GW1, and protects the circuitry coupled to the power line PW1 from an ESD. The protection circuit 1 functions as an electric current path when the ESD has occurred, and protects the function circuit 2.

The function circuit 2 is coupled to each of the power lines PW1 and GW1, and, for example, executes operations such as signal amplification and external device control. The function circuit 2 is protected by the protection circuit 1.

When operating the integrated circuit device IC, the power-supply voltage Vdd is used. For example, the power-supply voltage Vdd is applied to the power line PW1, and the power line GW1 is grounded. The power-supply voltage Vdd is, for example, 5V.

[1-2] Configuration of Protection Circuit 1

Continuously referring to FIG. 1, the configuration of the protection circuit 1 will be explained. The protection circuit 1 includes high voltage detection circuitry 10, first control circuitry 20, second control circuitry 30, and a transistor 40. Each of the high voltage detection circuitry 10, the first control circuitry 20, the second control circuitry 30, and the transistor 40 is coupled to each of the power lines PW1 and GW1, and operates based on the voltages of the power lines PW1 and GW1.

The high voltage detection circuitry 10 detects a high voltage caused by the ESD of the system level. Specifically, the high voltage detection circuitry 10 detects whether or not the voltage of the power line PW1 exceeds a threshold voltage Vh, and outputs the detection result to the first control circuitry 20. The threshold voltage Vh is a voltage used as a reference for detecting a high voltage caused by the ESD of the system level. Specifically, the threshold voltage Vh is higher than the power-supply voltage Vdd, and lower than twice the power-supply voltage Vdd. For example, in the case where the power-supply voltage Vdd is 5V, the threshold voltage Vh is, for example, 7V.

The first control circuitry 20 receives the detection result from the high voltage detection circuitry 10. The first control circuitry 20 controls the operation of the second control circuitry 30 based on the detection result of the high voltage detection circuitry 10.

The second control circuitry 30 detects the ESD of the device level. Specifically, the second control circuitry 30 detects whether or not the voltage of the power line PW1 has risen rapidly. The second control circuitry 30 controls the transistor 40 based on the control by the first control circuitry 20, and the detection result on whether or not the voltage of the power line PW1 has risen rapidly.

One end of the electric current path of the transistor 40 is coupled to the power line PW1. The other end of the electric current path of the transistor 40 is coupled to the power line GW1. A gate of the transistor 40 is coupled to the second control circuitry 30. The transistor 40 is turned "ON" or "OFF" based on the control of the second control circuitry 30.

Figure 2:
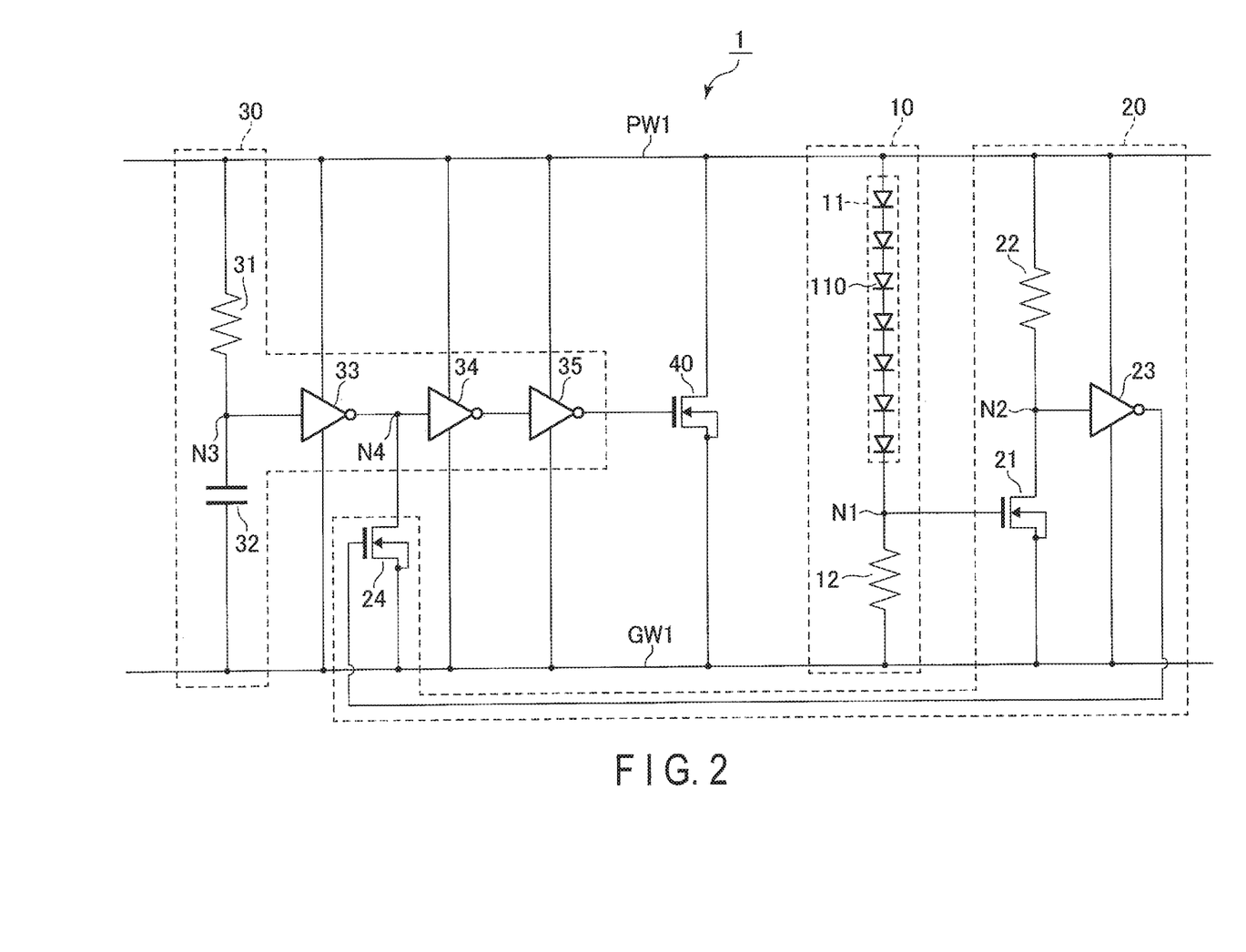
FIG. 2 is a circuit diagram showing an example of a circuit configuration of the protection circuit according to the embodiment.

FIG. 2 is a circuit diagram showing an example of a circuit configuration of the protection circuit 1 according to the embodiment. The high voltage detection circuitry 10 includes a diode string 11 and a resistor element 12. The diode string 11 is used as a detector element for detecting a high voltage caused by the ESD of the system level. The diode string 11 includes a plurality of diodes 110 coupled in series. In the embodiment, each of the seven diodes is coupled in series in a manner that an anode is on the power line PW1 side and a cathode is on the power line GW1 side. The threshold voltage of each diode is, for example, 1V. The anode side end of the diode string 11 is coupled to the power line PW1. The cathode side end of the diode string 11 is coupled to a node N1. One end of the resistor element 12 is coupled to the node N1. The other end of the resistor element 12 is coupled to the power line GW1. The resistance value of the resistor element 12 is set in a manner that the voltage of the node N1 of when an electric current has flowed to the resistor element 12 via the diode string 11 is able to turn "ON" a transistor 21 inside the first control circuitry 20. The resistance value of the resistor element 12 is, for example, larger than 1 kΩ. The node N1 is an output node of the detection result of the high voltage detection circuitry 10.

The first control circuitry 20 includes transistors 21 and 24, a resistor element 22, and an inverter 23. The transistors 21 and 24 are, for example, an N-type MOSFET. Each of a source and a back-gate of the transistor 21 is coupled to the power line GW1. A drain of the transistor 21 is coupled to a node N2. A gate of the transistor 21 is coupled to the node N1. One end of the resistor element 22 is coupled to the power line PW1. The other end of the resistor element 22 is coupled to the node N2. The positive-side power-supply terminal of the inverter 23 is coupled to the power line PW1. The negative-side power-supply terminal of the inverter 23 is coupled to the power line GW1. The inverter 23 inverts a logic level of the node N2, and outputs it to a gate of a transistor 24. Each of a source and a back-gate of the transistor 24 is coupled to the power line GW1. A drain of the transistor 24 is coupled to a node N4. The resistance value of the resistor element 22 is set to a resistance value that would allow the voltage of the node N2 to become an "L" level when the transistor 21 is turned "ON". The resistance value of the resistor element 22 is, for example, larger than 1 kΩ.

The second control circuitry 30 includes a resistor element 31, a capacitor 32, and inverters 33 to 35. One end of the resistor element 31 is coupled to the power line PW1. The other end of the resistor element 31 is coupled to a node N3. One electrode of the capacitor 32 is coupled to the node N3. The other electrode of the capacitor 32 is coupled to the power line GW1. A positive-side power-supply terminal of each of the inverters 33 to 35 is coupled to the power line PW1. A negative-side power-supply terminal of each of the inverters 33 to 35 is coupled to the power line GW1. The inverter 33 inverts a logic level of the node N3, and outputs it to the node N4. The inverter 34 inverts a logic level of the node N4, and outputs it to the inverter 35. The inverter 35 inverts a logic level received from the inverter 34, and outputs it to a gate of the transistor 40.

When the voltage of the power line PW1 changes, the change in the voltage of the node N3 is delayed by an RC time constant. The RC time constant is determined by the resistance value of the resistor element 31 and the capacitance value of the capacitor 32. In the embodiment, the resistance value of the resistor element 31 and the capacitance value of the capacitor 32 are set to values that would allow the RC time constant to become sufficiently longer than a time during which an instant electric current flow-in occurs by the ESD. In other words, while the instant electric current flow-in is caused to occur by the ESD, the voltage of the node N3 is kept almost constant.

In the case where the transistor 24 is turned "ON", the logic level of the node N4 becomes an "L" level regardless of the output of the inverter 33. Specifically, in the case where the transistor 24 is turned "ON", and the inverter 33 outputs an "H" level to the node N4, the voltage of the node N4 becomes an "L" level. In the case where the transistor 24 is turned "ON", and the inverter 33 outputs an "L" level to the node N4, the voltage of the node N4 becomes an "L" level.

In contrast, in the case where the transistor 24 is turned "OFF", the logic level of the node N4 is determined by the output of the inverter 33. Specifically, in the case where the transistor 24 is turned "OFF", and the inverter 33 outputs an "H" level to the node N4, the voltage of the node N4 becomes an "H" level. In the case where the transistor 24 is turned "OFF", and the inverter 33 outputs an "L" level to the node N4, the voltage of the node N4 becomes an "L" level.

In the case where the transistor 24 is turned "ON", and the inverter 33 outputs an "H" level to the node N4, each of the transistor 24 and the inverter 33 is configured so that the voltage of the node N4 becomes an "L" level. For example, an ON-resistance of the transistor 24 is smaller than an ON-resistance of when the inverter 33 outputs an "H" level.

In the embodiment, each of the inverters 23, 33, 34, and 35 operates by setting half the voltage of the power-supply voltage as the threshold voltage of the logic level. The threshold voltage of the logic level is a voltage that is used as a threshold value when determining whether the logic level of the node is an "H" level or an "L" level. For example, in the case where the power-supply voltage is 5V, the threshold voltage of the logic level becomes 2.5V, and 3V is determined as an "H" level, and 2V is determined as an "L" level. Furthermore, in the case where the power-supply voltage increases, the threshold voltage of the logic level also increases. For example, in the case where the power-supply voltage is 10V, the threshold voltage of the logic level becomes 5V. In this specification, in a state where the power-supply voltage is approximately 0V, or in a state where the power-supply voltage is low, and the circuit does not operate normally, the logic level will not be set. Furthermore, an electric current amount the inverter 34 is capable of outputting is larger than that of the inverter 33. An electric current amount the inverter 35 is capable of outputting is larger than that of the inverter 34.

The second control circuitry 30 may also be expressed as including an RC unit that includes the resistor element 31 and the capacitor 32, and a logic unit that includes the inverters 33 to 35. Furthermore, the first control circuitry 20 and the logic unit included in the second control circuitry 30 may collectively be expressed as a controller.

The transistor 40 is, for example, an n-type MOSFET. A source and a back-gate of the transistor 40 are coupled to the power line GW1. A drain of the transistor 40 is coupled to the power line PW1. The transistor 40 is provided in a size that, when an electric current caused to flow in due to the ESD with respect to the integrated circuit device IC passes through the transistor 40 that is turned "ON", allows a potential difference between the source and the drain of the transistor 40 to become smaller than the threshold voltage Vh. The size of the transistor 40 is larger than, for example, the transistor 21 or the transistor 24.

[1-3] Configuration of System SYS Including Integrated Circuit Device IC Including Protection Circuit 1

Figure 3:
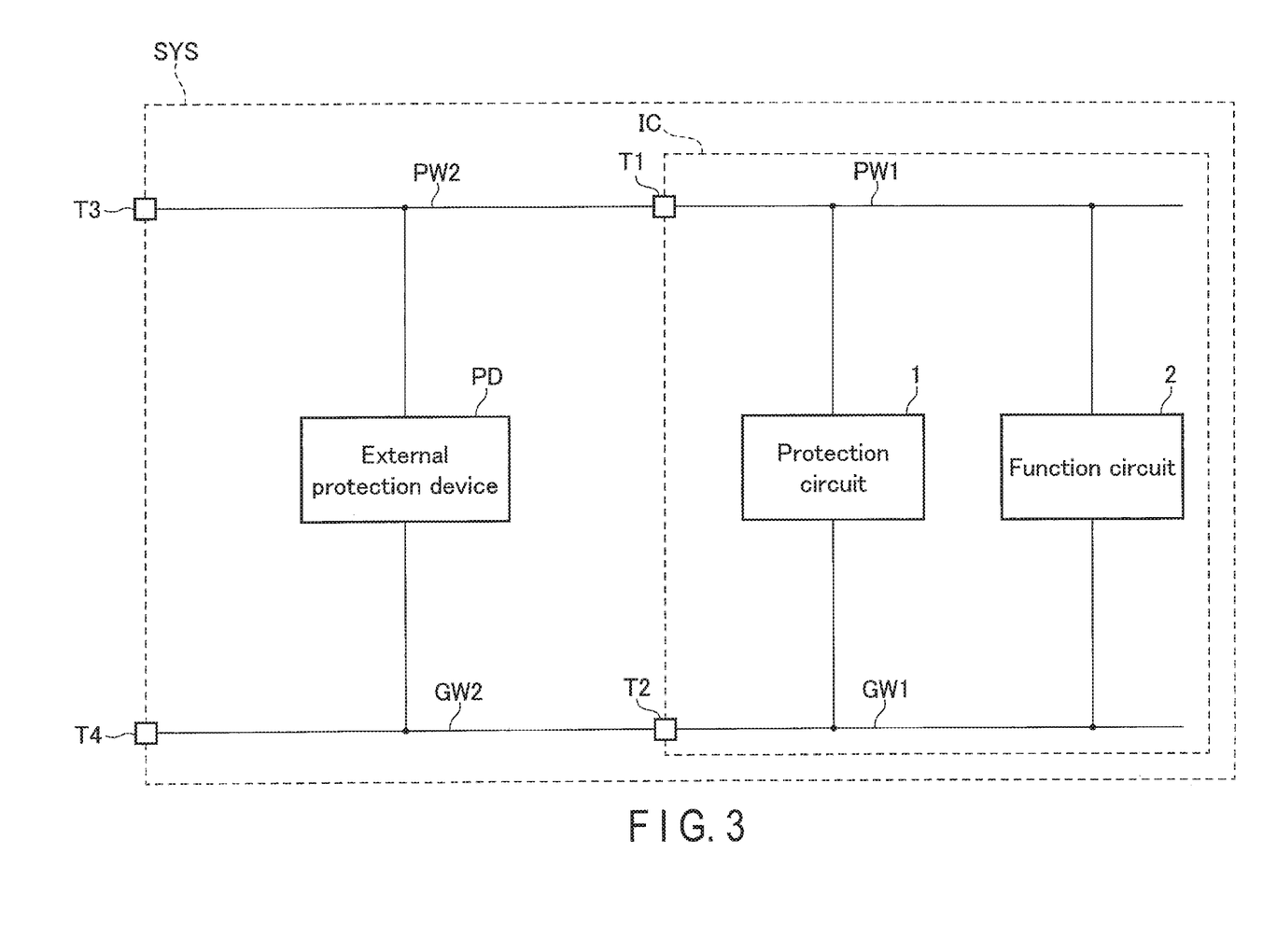
FIG. 3 is a block diagram showing a configuration example of a system including the integrated circuit device including the protection circuit according to the embodiment.

FIG. 3 shows a configuration example of a system SYS including the integrated circuit device IC including the protection circuit 1 according to the embodiment. The system SYS includes power lines PW2 and GW2, terminals T3 and T4, the integrated circuit device IC, and an external protection device PD.

Each of the power lines PW2 and GW2 is used to supply power-supply voltage to each device included in the system SYS. The terminal T3 is a positive-side power-supply terminal of the system SYS, and is coupled to the power line PW2. For example, a power-supply voltage Vdd is applied to the terminal T3. The terminal T4 is a negative-side power-supply terminal of the system SYS, and is coupled to the power line GW2. For example, a power-supply voltage Vss is applied to the terminal T4.

The integrated circuit device IC and the external protection device PD are, for example, mounted on a print circuit board. The integrated circuit device IC is coupled to the power line PW2 at the terminal T1, and is coupled to the power line GW2 at the terminal T2.

The external protection device PD is coupled to each of the power lines PW2 and GW2. The external protection device PD is turned "ON" when the difference between the voltage of the power line PW2 and the voltage of the power line GW2 exceeds a threshold voltage Vpd, and functions as an electric current path to protect the integrated circuit device IC from a high voltage caused by the ESD of the system level. The threshold voltage Vpd at which the external protection device PD is turned "ON" is higher than the power-supply voltage Vdd. For example, in the case where the power-supply voltage Vdd is 5V, the threshold voltage Vpd is, for example, 11V.

When operating the system SYS, the power-supply voltage Vdd is used. The power-supply voltage Vdd is, for example, 5V.

[2] Operation of Protection Circuit 1

The protection circuit 1 according to the embodiment performs different operations depending on conditions. In this specification, the operation of the protection circuit 1 will be explained by examples of two conditions such as a device test and a system test. The device test and the system test are tests for applying the ESD with respect to a test target by using a test device. The device test uses a single device as the test target. The system test uses a system to which a power-supply voltage is applied and that operates as the test target. In the following, the ESD applied in the device test will be referred to as a device ESD, and the ESD applied in the system test will be referred to as a system ESD.

[2-1] Operation of Protection Circuit 1 in Device Test

Figure 4:
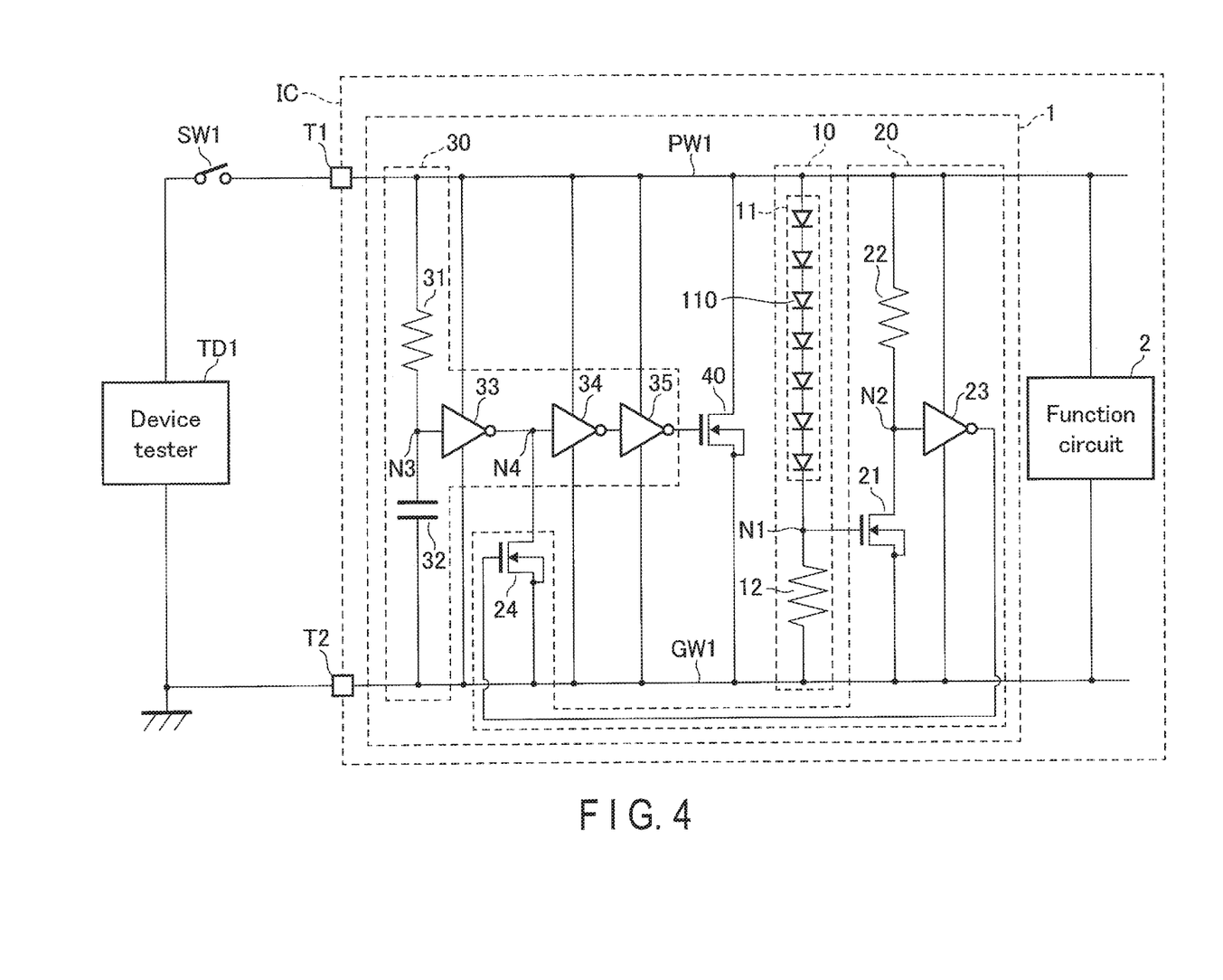
FIG. 4 is a circuit diagram for explaining an operation in a device test of the protection circuit according to the embodiment.
Figure 5:
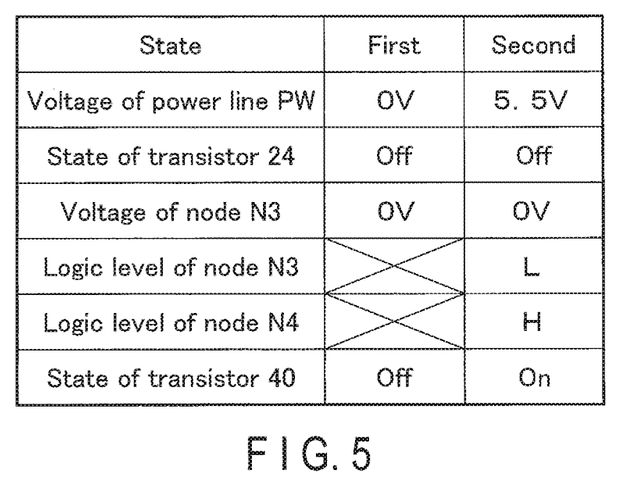
FIG. 5 is a table for explaining the operation in the device test of the protection circuit according to the embodiment.

First of all, with reference to FIG. 4 and FIG. 5, the operation of the protection circuit 1 according to the embodiment in the device test will be explained. FIG. 4 is a circuit diagram for explaining the device test. FIG. 5 is a table in which operations of the protection circuit 1 in each state of the device test are shown. As shown in FIG. 4, one end of a device tester TD1 is coupled to the terminal T1 via a switch SW1. The other end of the device tester TD1 is coupled to the terminal T2, and is grounded. The device tester TD1 can apply the device ESD to a device that is coupled to the device tester TD1.

In the device test, the device tester TD1 applies the device ESD to the integrated circuit device IC. The device test is, for example, a Human Body Model (HBM) test, a Machine Model (MM) test, and a Charged Device Model (CDM) test. A first state, which is a state before the device tester TD1 applies the device ESD to the integrated circuit device IC, and a second state, which is a state in which the device ESD is being applied, will be explained in order.

(First State: State Before Device ESD is Applied)

In the first state, the switch SW1 decouples the device tester TD1 and the terminal T1. The power-supply voltage is not supplied to the integrated circuit device IC, and the integrated circuit device IC is sufficiently discharged. The voltage of the power line PW1 is 0V. Since the power-supply voltage is not supplied, the transistor 24 is turned "OFF". Since the capacitor 32 is sufficiently discharged, the voltage of the node N3 is 0V. The logic level of each of the nodes N3 and N4 is not defined since the inverters 33 to 35 are not operated. Since the power-supply voltage is not supplied, the transistor 40 is turned "OFF".

(Second State: State in which Device ESD is being Applied)

In the second state, the switch SW1 couples the device tester TD1 and the terminal T1. The device tester TD1 applies an electric current of the device ESD to the terminal T1. Since the electric current is input via the terminal T1, the voltage of the power line PW1 rises. In the second state, the voltage of the power line PW1 is 5.5V.

Since the voltage of the power line PW1 does not satisfy the threshold voltage Vh, the high voltage detection circuitry 10 does not detect the ESD of the system level. As a result, the voltage of the node N1 becomes 0V. Since the voltage of the node N1 is 0V, the transistor 21 of the first control circuitry 20 is turned "OFF". As a result of the transistor 21 being turned "OFF", the voltage of the node N2 becomes 5.5V. The inverter 23 determines the voltage of the node N2, which is 5.5V, as an "H" level, and outputs an "L" level to the gate of the transistor 24. As a result of the "L" level being applied to the gate, the transistor 24 is turned "OFF".

In the second control circuitry 30, since the RC time constant which is determined by the resistance value of the resistor element 31 and the capacitance value of the capacitor 32 is sufficiently larger than a time during which the electric current of the device ESD is applied, the voltage of the node N3 is maintained at 0V. The inverter 33 determines the voltage of the node N3, which is 0V, as an "L" level and outputs an "H" level to the node N4. Since the transistor 24 of the first control circuitry is turned "OFF", the logic level of the node N4 becomes an "H" level. The inverter 34 inverts the "H" level of the node N4, and outputs an "L" level to the input of the inverter 35. The inverter 35 inverts the "L" level input from the inverter 34, and outputs an "H" level to the gate of the transistor 40.

Since the "H" level is applied to the gate, the transistor 40 is turned "ON". Since the transistor 40 is now turned "ON", the transistor 40 serves as an electric current path to allow the electric current of the device ESD to flow to the power line GW1, and to be discharged to a ground potential. The transistor 40 is provided so that, when the electric current of the device ESD flows, the potential difference between the source and the drain becomes smaller than the threshold voltage Vh. Therefore, the voltage of the power line PW1 is set to 5.5V, which is a lower value than the threshold voltage Vh.

As explained above, when the device ESD is applied to the integrated circuit device IC, the transistor 40 is turned on, and the voltage of the power line PW1 is kept lower than the threshold voltage Vh. In this manner, the protection circuit 1 is capable of protecting the function circuit 2 from the device ESD.

[2-2] Operation of Protection Circuit 1 in System Test

Figure 6:
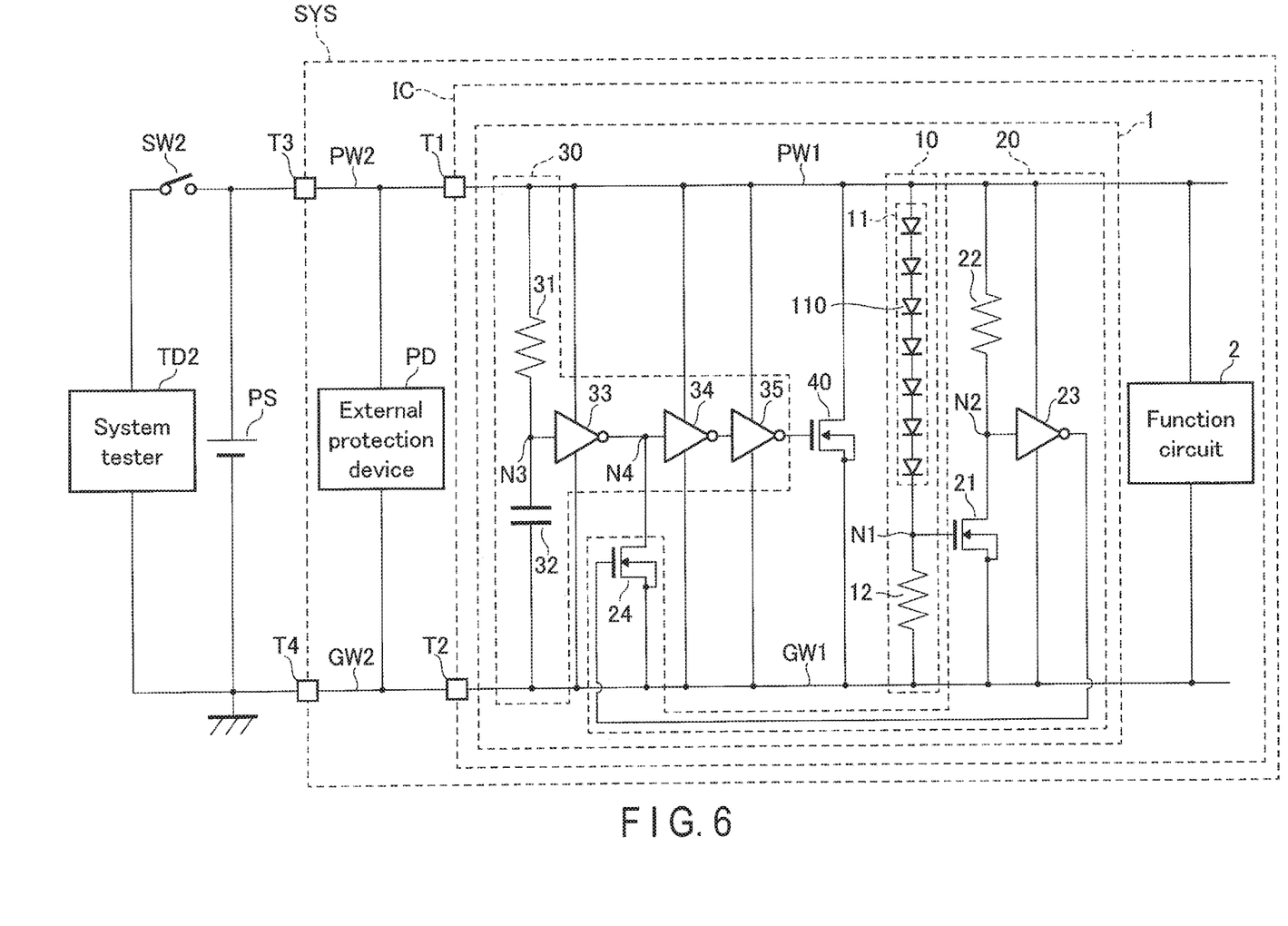
FIG. 6 is a circuit diagram for explaining an operation in a system test of the protection circuit according to the embodiment.
Figure 7:
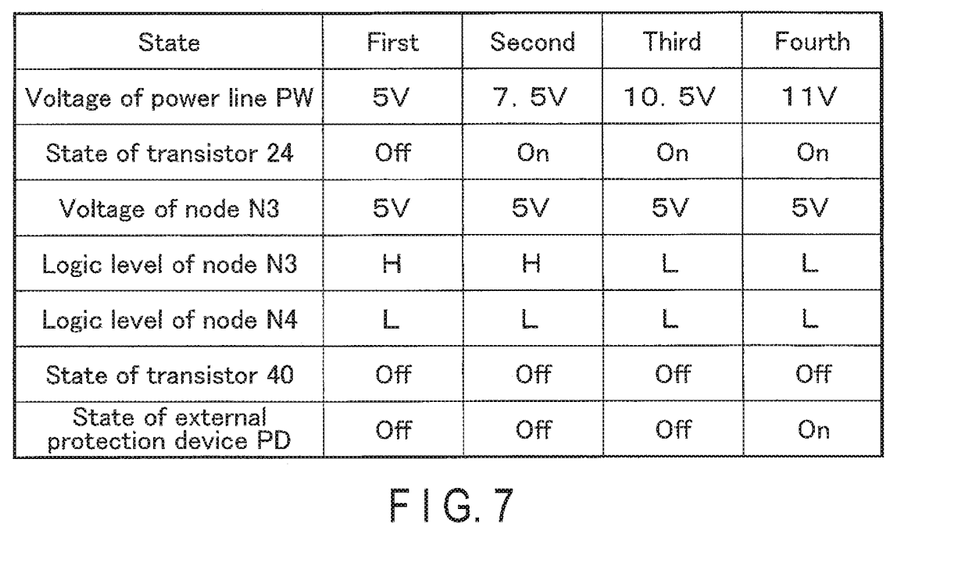
FIG. 7 is a table for explaining the operation in the system test of the protection circuit according to the embodiment.

Now, with reference to FIG. 6 and FIG. 7, the operation of the protection circuit 1 according to the embodiment in the system test will be explained. As shown in FIG. 6, a positive-side output of a voltage source PS is coupled to the terminal T3. A negative-side output of the voltage source PS is coupled to the terminal T4, and is grounded. The voltage source PS supplies the power-supply voltage Vdd to the system SYS. The power-supply voltage Vdd is 5V. one end of a system tester TD2 is coupled to the terminal T3 via a switch SW2. The other end of the system tester TD2 is coupled to the terminal T4. The system tester TD2 is capable of applying the system ESD to a system that is coupled to the system tester TD2.

In the system test, the system tester TD2 applies the system ESD to the system SYS to which the power-supply voltage is supplied. The system test is, for example, a test that is defined by IEC61000-4-2. A first state, which is a state before the system tester TD2 applies the system ESD, and second to fourth states, which are states in which the system tester TD2 applies the system ESD, and the voltage of each of the power lines PW1 and PW2 has risen, will be explained in order.

In the explanation of the system test, for the sake of simplicity, the voltage of the power line PW1 and the voltage of the power line PW2 will be considered as being equal. Hereinafter, in the explanation of the system test, the voltage of the power line PW1 and the voltage of the power line PW2 will be collectively referred to as the voltage of the power line PW. Furthermore, in the mathematical formula, terms will be abbreviated; therefore, the voltage of the power line PW will be expressed as Vpw, the power-supply voltage will be expressed as Vdd, the threshold voltage of the high voltage detection circuitry will be expressed as Vh, and the threshold voltage of the external protection device PD will be expressed as Vpd.

(First State: State Before System ESD is Applied)

In the first state, the switch SW2 decouples the device tester TD2 and the terminal T3. The system SYS is operated by the power-supply voltage Vdd, which is 5V, supplied from the voltage source PS. The voltage of the power line PW is 5V.

Since the voltage of the power line PW does not satisfy the threshold voltage Vh, the high voltage detection circuitry 10 does not detect the ESD of the system level. As a result, the voltage of the node N1 becomes 0V. Since the voltage of the node N1 is 0V, the transistor 21 of the first control circuitry 20 is turned "OFF". As a result of the transistor 21 being turned "OFF", the voltage of the node N2 becomes 5V. The inverter 23 determines the voltage of the node N2, which is 5V, as an "H" level, and outputs an "L" level to the gate of the transistor 24. As a result of the "L" level being applied to the gate, the transistor 24 is turned "OFF".

In the second control circuitry 30, the capacitor 32 is charged with the voltage of the power line PW, which is 5V, via the resistor element 31. Therefore, the voltage of the node N3 is 5V. The inverter 33 determines the voltage of the node N3, which is 5V, as an "H" level and outputs an "L" level to the node N4. The transistor 24 of the first control circuitry is turned "OFF", and the logic level of the node N4 becomes an "L" level. The inverters 34 and 35 output an "L" level to the gate of the transistor 40 based on the "L" level of the node N4. Since the "L" level is applied to the gate, the transistor 40 is turned "OFF".

The external protection device PD remains turned "OFF" since the voltage of the power line PW, which is 5V, does not satisfy the threshold voltage of 11V to start the protection operation.

In this manner, in the first state where the system tester TD2 is decoupled, the system SYS operates by using 5V, which is the power-supply voltage Vdd. In the first state, the transistor 40 and the external protection device PD are turned "OFF".

(Second State: In Case where System ESD is Applied, and Vh≤Vpw<Vdd×2 is Satisfied)

In the second state, the switch SW2 couples the system tester TD2 and the terminal T3. The device tester TD2 applies an electric current of the system ESD to the terminal T3. Since the electric current is input via the terminal T3, the voltage of the power line PW increases. In the second state, the voltage of the power line PW is equal to or higher than the threshold voltage Vh and lower than twice the power-supply voltage Vdd. As an example, a state in which the voltage of the power line PW has increased to 7.5V will be explained.

Since the voltage of the power line PW, which is 7.5V, exceeds 7V, which is the threshold voltage Vh, the high voltage detection circuitry 10 detects the ESD of the system level. Specifically, the diode string 11 is turned "ON", and the electric current flows from the power line PW to the power line GW via the diode string 11 and the resistor element 12. As a result of the electric current flowing in the resistor element 12, the voltage of the node N1 increases to a voltage that is sufficient to turn on the transistor 21. As a result of the voltage of the node N1 increasing, the transistor 21 of the first control circuitry 20 is turned "ON", and the voltage of the node N2 becomes an "L" level. The inverter 23 inverts the "L" level of the node N2, and outputs an "H" level to the gate of the transistor 24. As a result of the "H" level being applied to the gate, the transistor 24 is turned "ON".

In the second control circuitry 30, since the RC time constant which is determined by the resistance value of the resistor element 31 and the capacitance value of the capacitor 32 is sufficiently larger than a time during which the electric current of the system ESD is applied, the voltage of the node N3 is maintained at 5V, which is the same as the first state. The inverter 33 determines the voltage of the node N3, which is 5V, as an "H" level and outputs an "L" level to the node N4. As a result, in the same manner as in the first state, the transistor 40 remains turned "OFF".

The external protection device PD remains turned "OFF" since the voltage of the power line PW, which is 7.5V, does not satisfy the threshold value to start the protection operation, which is 11V.

In this manner, when the voltage of the power line PW increases to 7.5V by the electric current of the system ESD, the high voltage detection circuitry 10 detects the ESD of the system level, and the transistor 24 is turned "ON". Furthermore, the voltage of the power line PW caused by the electric current of the system ESD continues to increase.

(Third State: In Case where Vdd×2≤Vpw<Vpd is Satisfied)

The third state is a state in which the voltage of the power line PW continuously increases from the second state. In the third state, the voltage of the power line PW increases by the electric current of the system ESD, and becomes equal to or higher than twice the power-supply voltage Vdd and lower than the threshold voltage Vpd of the external protection device PD. As an example, a state in which the voltage of the power line PW has become 10.5V will be explained.

The high voltage detection circuitry 10 detects the ESD of the system level continuously from the second state. The transistor 24 of the first control circuitry 20 remains turned "ON" continuously from the second state.

In the second control circuitry 30, the voltage of the node N3 is maintained at 5V continuously from the second state. Since the voltage of the power line PW has become 10.5V, the threshold voltage of the logic level of the inverter 33 becomes 5.25V, which is half the voltage of the power line PW. Since the threshold voltage of the logic level has become 5.25V, the inverter 33 determines the voltage of the node N3, which is 5V, as an "L" level and outputs an "H" level to the node N4. However, since the transistor 24 of the first control circuitry 20 is turned "ON", the voltage of the node N4 becomes an "L" level. As a result, in the same manner as in the first state, the transistor 40 remains turned "OFF".

The external protection device PD remains turned "OFF" since the voltage of the power line PW, which is 10.5V, does not satisfy the threshold value to start the protection operation, which is 11V.

In this manner, when the voltage of the power line PW increases to twice the power-supply voltage Vdd or more by the electric current of the system ESD, the logic level of the node N3 is determined as the "L" level. Therefore, the inverter 33 outputs an "H" level to the node N4; however, the node N4 maintains an "L" level by the transistor 24, and the transistor 40 remains turned "OFF". Furthermore, the voltage of the power line PW caused by the electric current of the system ESD continues to increase.

(Fourth State: In Case where Vpd≤Vpw is Satisfied)

The fourth state is a state in which the voltage of the power line PW continuously increases from the third state. In the fourth state, the voltage of the power line PW increases by the electric current of the system ESD, and the voltage of the power line PW becomes equal to or higher than the threshold voltage Vpd of the external protection device PD. As an example, a state in which the voltage of the power line PW has become 11V will be explained.

The operation of the protection circuit 1 is maintained without changing from the third state.

Specifically, the transistor 24 remains turned "ON", and the transistor 40 remains turned "OFF".

The external protection device PD is turned "ON" since the voltage of the power line PW, which is 11V, has satisfied the threshold voltage of 11V to start the protection operation. Specifically, the discharge with the external protection device PD serving as the electric current path is started, and the increase in the voltage of the power line PW caused by the electric current of the system ESD is suppressed.

In this manner, when the voltage of the power line PW increases to 11V, which is equal to or higher than the threshold voltage Vpd of the external protection device PD, by the electric current of the system ESD, the external protection device PD is turned "ON" while the transistor 40 remains turned "OFF".

As explained above, when the system ESD is applied to the system SYS, the external protection device PD is turned on while the transistor 40 of the protection circuit 1 remains turned "OFF", thereby protecting the system SYS.

[3] Advantageous Effects of Embodiment

According to the above-described protection circuit 1 of the embodiment, it is possible to suppress breakage of the transistor, thus improving operational reliability. Hereinafter, specific effects of the protection circuit 1 according to the embodiment will be explained.

In a semiconductor device, an ESD may be applied in a state of a stand-alone device or in a state in which the device is embedded and operated in a system. Therefore, in order to protect the device from the device ESD, a protection circuit is provided inside the device. Furthermore, in order to protect the system from the system ESD, the system is provided with a protection circuit separately from the protection circuit inside the device.

The protection circuit inside the device includes, for example, a MOSFET that functions as an electric current path. The MOSFET that operates as the electric current path is provided in a manner that would endure the electric current and the voltage caused by the device ESD. Furthermore, the protection device is provided in a manner that would endure the electric current and the voltage caused by the system ESD. The electric current and the voltage caused by the system ESD are larger than the electric current and the voltage caused by the device ESD.

When a high voltage is applied between the gate and the drain, the MOSFET may assume a snapback state. A snapback state is a state in which a bipolar transistor that is parasitic to the MOSFET is turned "ON". The MOSFET easily assumes a snapback state when turned "ON", and becomes difficult to assume a snapback state when turned "OFF". Specifically, an n-type MOSFET easily assumes a snapback state when the voltage applied to the gate is high, and becomes difficult to assume a snapback state when the voltage applied to the gate is low. In the snapback state, a snapback current may flow in the parasitic bipolar transistor. When the snapback current becomes larger than the electric current amount the parasitic bipolar transistor is able to endure, the parasitic bipolar transistor will be destroyed. When the parasitic bipolar transistor is destroyed, the MOSFET to which the bipolar transistor is parasitic will also be destroyed. This phenomenon is, for example, referred to as snapback destruction.

In the case where the ESD has occurred to the system SYS, and the voltage of the power line PW has increased, for example, when the transistor 40 of the protection circuit 1 included in the integrated circuit device IC is turned "ON", there is a possibility that the transistor 40 may be subjected to snapback destruction. It is preferable for the transistor 40 to remain turned "OFF" after the ESD has occurred to the system SYS until the external protection device PD becomes an electric current path and discharges the electric current of the ESD.

To deal with such matter, the protection circuit 1 according to the embodiment includes the high voltage detection circuitry 10 and the first control circuitry 20. When the system ESD has occurred to the system SYS, the high voltage detection circuitry 10 detects the ESD of the system level by detecting the high voltage caused by the ESD of the system level in the power line PW1. When the high voltage detection circuitry 10 detects the ESD of the system level, the first control circuitry 20 controls the second control circuitry 30 in a manner to keep the transistor 40 turned "OFF".

Furthermore, when the device ESD has occurred to the integrated circuit device IC, the protection circuit 1 according to the embodiment controls the second control circuitry 30 to turn "ON" the transistor 40, and limits the voltage in the power line PW1 to become lower than the threshold voltage Vh. Since the voltage in the power line PW1 is limited to become lower than the threshold voltage Vh, the high voltage detection circuitry 10 does not detect the ESD of the system level.

In this manner, in the case where the ESD has occurred to the system SYS, the protection circuit 1 according to the embodiment can keep the transistor 40 turned "OFF". Furthermore, when the device ESD has occurred to the integrated circuit device IC, the transistor 40 may be turned "ON" to protect the integrated circuit device IC. That is, the protection circuit 1 according to the embodiment can suppress the transistor 40 from being subjected to the snapback destruction by the system ESD without disturbing the protection operation with respect to the device ESD. Therefore, the protection circuit 1 according to the embodiment can improve operational reliability.

[4] Other Modifications, Etc.

In the embodiment, an example of a specific voltage value has been given regarding the power-supply voltage and each of the threshold voltages; however, the present invention is not limited thereto. Different values can be used for the power-supply voltage and each of the threshold voltages, in a range where a given magnitude relationship is satisfied. For example, in the case where the power-supply voltage Vdd is 5V, the threshold voltage Vh of the high voltage detection circuitry may be 6V or 8V. The threshold voltage Vh can be changed in a range where it is higher than the power-supply voltage Vdd, and lower than twice the power-supply voltage Vdd. Furthermore, the power-supply voltage Vdd may be, for example, 3.3V or 12V. In accordance with the power-supply voltage Vdd, each of the threshold voltages is set to a value that satisfies a given magnitude relationship.

The number of diodes 110 included in the diode string 11 of the high voltage detection circuitry 10 can be changed together with the threshold voltage Vh. In the embodiment, by coupling seven diodes 110, each of which has a threshold voltage of approximately 1V, in series, the threshold voltage Vh of 7V is realized. The threshold voltage and the number of diodes 110 are not limited thereto. For example, by coupling six diodes 110, each of which has a threshold voltage of approximately 1V, in series, the threshold voltage Vh may be set to 6V. Alternatively, for example, by coupling ten diodes, each of which has a threshold voltage of 0.7V, in series, the threshold voltage Vh of 7V may be realized.

Figure 8:
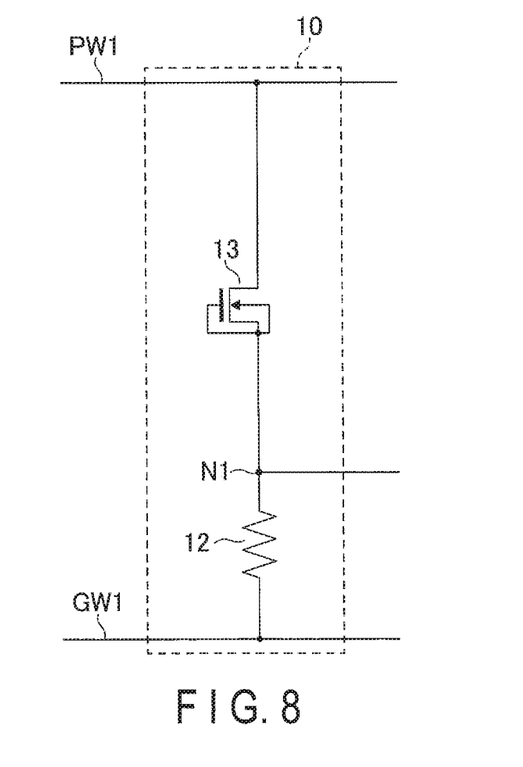
FIG. 8 is a circuit diagram showing an example of a circuit configuration of high voltage detection circuitry according to a modification of the embodiment.

Furthermore, in the embodiment, the diode string 11 is used as the detector element; however, it is not limited thereto. For example, the MOSFET may also be used as the detector element. FIG. 8 illustrates an example of a circuit configuration of the high voltage detection circuitry 10 according to a modification of the embodiment. The high voltage detection circuitry 10 according to the modification includes the resistor element 12 and a transistor 13. The transistor 13 is, for example, an n-type MOSFET. A drain of the transistor 13 is coupled to the power line PW. Each of a source, a gate, and a back-gate of the transistor 13 is coupled to the node N1. One end of the resistor element 12 is coupled to the node N1. The other end of the resistor element 12 is coupled to the power line GW.

In the case where the voltage of the power line PW1 becomes equal to or higher than the threshold voltage Vh, the transistor 13 assumes a snapback state. When the transistor 13 assumes the snapback state, the parasitic bipolar transistor is turned "ON", and an electric current flows from the power line PW1 to the node N1. The flow of the electric current causes a potential of the node N1 to rise, and the voltage of the power line PW1 can be detected as becoming equal to or higher than the threshold voltage Vh. The amount of electric current flowing in the parasitic transistor is limited by the resistor element 12. Therefore, the transistor 13 may be suppressed from being subjected to snapback destruction. The voltage at which the transistor 13 assumes the snapback state relates to a gate length of the transistor 13. By setting the gate length of the transistor 13 appropriately, the transistor 13 can assume a snapback state when the voltage of the power line PW1 is equal to or higher than the threshold voltage Vh.

Furthermore, the high voltage detection circuitry 10 may use a zener diode 14 as the detector element. In a modification using the zener diode 14 of the high voltage detection circuitry 10, the high voltage detection circuitry 10 includes the resistor element 12 and the zener diode 14. A cathode of the zener diode 14 is coupled to the power line PW1. An anode of the zener diode 14 is coupled to the node N1. One end of the resistor element 12 is coupled to the node N1. The other end of the resistor element 12 is coupled to the power line GW. By a configuration in which a breakdown voltage of the zener diode 14 is set equal to the threshold voltage Vh, the voltage of the power line PW1 can be detected when it is equal to or higher than the threshold voltage Vh.

Furthermore, the high voltage detection circuitry 10 may use a resistor element 15 as the detector element. In a modification using the resistor element 15 of the high voltage detection circuitry 10, the high voltage detection circuitry 10 includes the resistor element 12 and the resistor element 15. One end of the resistor element 15 is coupled to the power line PW1. The other end of the resistor element 15 is coupled to the node N1. One end of the resistor element 12 is coupled to the node N1. The other end of the resistor element 12 is coupled to the power line GW. By such configuration, a voltage obtained by dividing the voltage of the power line PW1 by the resistor element 15 and the resistor element 12 occurs on the node N1. By appropriately setting the ratio between the resistance value of the resistor element 15 and the resistance value of the resistor element 12, in the case where the voltage of the power line PW1 becomes equal to or higher than the threshold voltage Vh, the transistor 21 of the first control circuitry 20 whose gate is coupled to the node N1 can be turned "ON".

Figure 9:
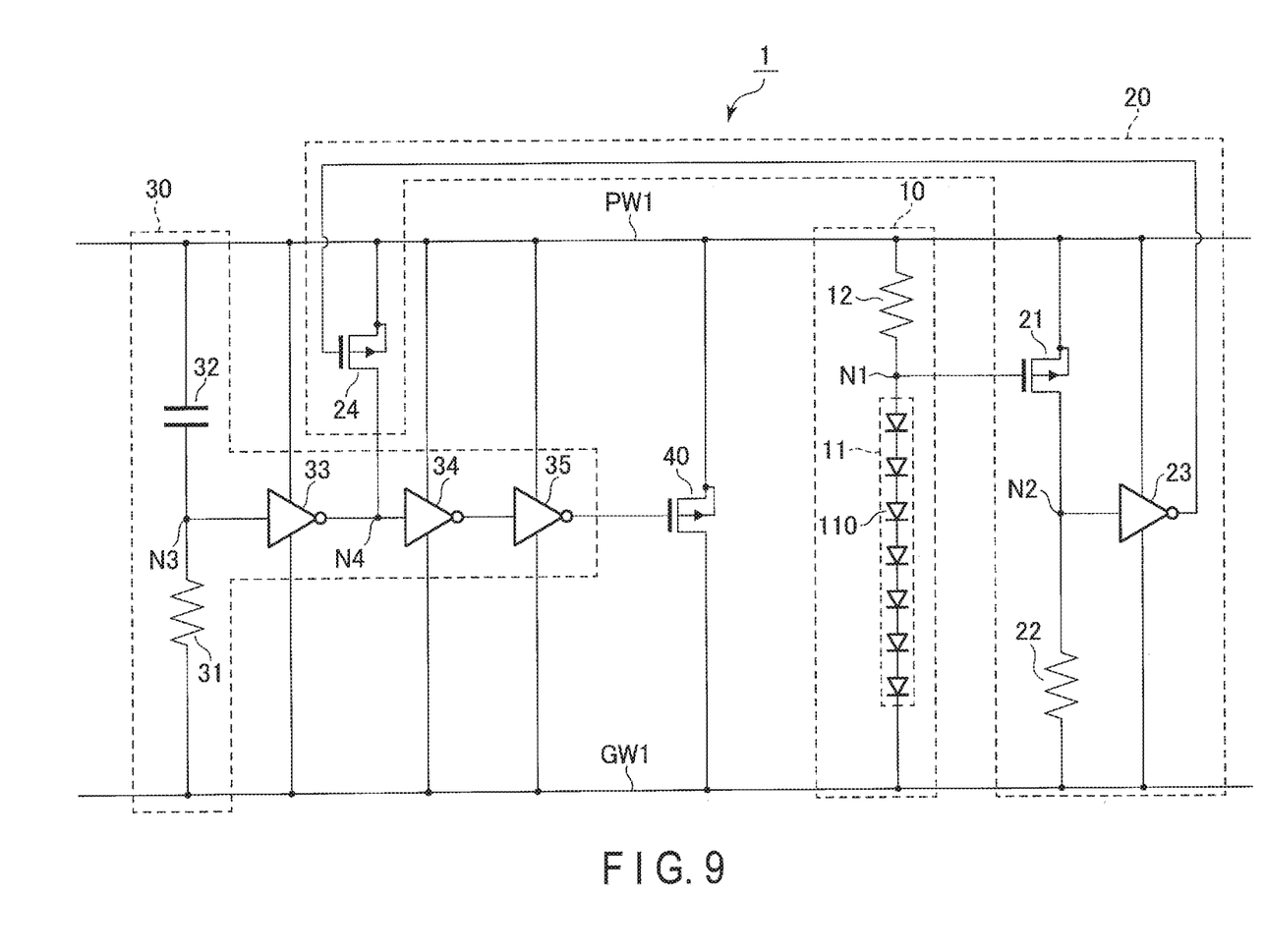
FIG. 9 is a circuit diagram showing an example of a circuit configuration of a protection circuit according to a modification of the embodiment.

In the embodiment, an example of a case in which the transistor 21, the transistor 24, and the transistor 40 are an n-type MOSFET has been explained. Furthermore, an example of a configuration in which the anode side end of the diode string 11 and one end of the resistor element 31 are coupled to the power line PW1, and the source of the transistor 24 is coupled to the power line GW1 has been explained. The embodiment of the present invention is not limited to this. For example, the configuration may be changed in the manner shown in FIG. 9. FIG. 9 is a circuit diagram showing a modification of a circuit configuration of the protection circuit 1 according to the embodiment.

In the modification shown in FIG. 9, the transistor 21, the transistor 24, and the transistor 40 are a p-type MOSFET. Furthermore, the other end of the resistor element 12 is coupled to the power line PW1. The cathode side end of the diode string 11 is coupled to the power line GW1. Each of the source and the back-gate of the transistor 21 is coupled to the power line PW1. One end of the resistor element 22 is coupled to the power line GW1. Each of the source and the back-gate of the transistor 24 is coupled to the power line PW1. One end of the resistor element 31 is coupled to the power line GW1. The other end of the capacitor 32 is coupled to the power line PW1. Each of the source and the back-gate of the transistor 40 is coupled to the power line PW1. The drain of the transistor 40 is coupled to the power line GW1. The protection circuit 1 according to the modification configured in the above manner can suppress the transistor 40 from being subjected to the snapback destruction caused by the system ESD, and can improve operational reliability in the same manner as the embodiment.

Furthermore, it is also possible to change the configurations of the inverter 33, the inverter 34, and the inverter 35 coupled in series. For example, the inverter 34 and the inverter 35 may be deleted, and the gate of the transistor 40 and the node N4 may be coupled. In this case, the transistor 24 is provided in a manner that, in the case where the transistor 24 is turned "ON", the transistor 40 is turned "OFF".

Furthermore, the number of inverters to be coupled in series between the node N3 and the transistor 40 may be changed. For example, in the case of changing the transistor 40 to a p-type MOSFET from the configuration of FIG. 2 explained in the embodiment, the number of inverters coupled in series and provided may be changed to even numbers. Specifically, the inverter 35 may be deleted, and the output end of the inverter 34 may be coupled to the gate of the transistor 40. Alternatively, the inverter 36 may be inserted between the output end of the inverter 35 and the gate of the transistor 40.

The resistor element and the capacitor may be configured using a transistor. For example, by utilizing the relationship between the electric current and the voltage possessed by the transistor, the transistor may be used as a resistor. Furthermore, for example, by utilizing the gate capacity of the MOSFET, the MOSFET may be used as a capacitor.

In the present specification, when the inverter outputs an "H" level, it indicates that a voltage approximately equal to a voltage of a positive-side power-supply terminal of the inverter is output. When the inverter outputs an "L" level, it indicates that a voltage approximately equal to a voltage of a negative-side power-supply terminal of the inverter is output.

In the present specification, the magnitude relationship of the size of the transistor indicates whether an aspect ratio (W/L) determined from a gate length L and a gate width W of the gate electrode is large or small, or whether the gate length L or the gate width W of the gate electrode is large or small.

In the present specification, the term "couple" refers to electrical coupling, and does not exclude intervention of, for example, another element. In addition, "electrical coupling" may be performed via an insulator, if the same operation is ensured thereby.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A protection circuit comprising:
   a first power line;
   a second power line;
   a first controller including:
   a first resistor element, one end of the first resistor element being coupled to the first power line;
   a capacitor, one electrode of the capacitor being coupled to the second power line;
   a first inverter, an input end of the first inverter being coupled to each of the other end of the first resistor element and the other electrode of the capacitor;
   a second inverter, an input end of the second inverter being coupled to an output end of the first inverter; and
   a third inverter, an input end of the third inverter being coupled to an output end of the second inverter;
   a first transistor, a gate of the first transistor being coupled to an output end of the third inverter, one end of the first transistor being coupled to the first power line, and the other end of the first transistor being coupled to the second power line;
   a detector including:
   a diode string that includes a plurality of diodes coupled in series, an anode of each of the diodes being coupled on the first power line side, and an anode side end of the diode string being coupled to the first power line; and
   a second resistor element, one end of the second resistor being coupled to the second power line, and the other end of the second resistor being coupled to a cathode side end of the diode string; and
   a second controller including:
   a second transistor, a gate of the second transistor being coupled to each of the cathode side end of the diode string and the other end of the second resistor element, one end of the second transistor being coupled to the second power line;
   a third resistor element, one end of the third resistor element being coupled to the first power line;
   a fourth inverter, an input end of the fourth inverter being coupled to each of the other end of the second transistor and the other end of the third resistor; and
   a third transistor, a gate of the third transistor being coupled to an output end of the fourth inverter, one end of the third transistor being coupled to the second power line, and the other end of the third transistor being coupled to each of the output end of the first inverter and the input end of the second inverter.

2. The protection circuit according to claim 1, wherein
   in a case where a voltage difference between a voltage of the first power line and a voltage of the second power line is smaller than a first voltage, the third transistor is turned "OFF", and
   in a case where the voltage difference between the voltage of the first power line and the voltage of the second power line is equal to or larger than the first voltage, the third transistor is turned "ON".

3. The protection circuit according to claim 2, wherein the first voltage is higher than a power-supply voltage, and lower than twice the power-supply voltage.

4. The protection circuit according to claim 1, wherein, in a case where the third transistor is turned "ON", a voltage of the input end of the second inverter is close to a voltage of the second power line than to an average of a voltage of the first power line and the voltage of the second power line.

5. The protection circuit according to claim 1, wherein a size of the first transistor is larger than the second transistor and the third transistor.

6. The protection circuit according to claim 1, wherein, in a case where a power-supply voltage is applied to the first power line, the second power line is grounded, and an electric current caused by an ESD flows into the first power line, the first transistor remains turned "OFF".

7. The protection circuit according to claim 6, wherein, in a case where an electric current caused by an ESD flows into the first power line in a state where a voltage is not applied to the first power line, the first transistor is turned "ON".

8. A protection circuit comprising:
   a first power line;
   a second power line;
   a first transistor provided between the first power line and the second power line; and
   control circuitry that controls the first transistor based on a difference between a voltage of the first power line and a voltage of the second power line, wherein
   the control circuitry,
   in a case where a difference between a voltage of the first power line and a voltage of the second power line is smaller than a first voltage, controls the first transistor to be turned "ON" or "OFF", and
   in a case where a difference between a voltage of the first power line and a voltage of the second power line is equal to or larger than the first voltage, controls the first transistor to be turned "OFF", wherein
   the first voltage is higher than a power-supply voltage, and lower than twice the power-supply voltage.

9. The protection circuit according to claim 8, wherein the control circuitry comprises:
   a detector including a detector element and a first resistor element coupled in series between the first power line and the second power line;
   an RC unit including a second resistor element and a capacitor coupled in series between the first power line and the second power line; and
   a controller including a first inverter, an input end of the first inverter being coupled to a first node between the second resistor element and the capacitor, and an output end of the first inverter being coupled to a second node, and a second transistor provided between the second node and the first power line, or between the second node and the second power line, wherein
   the controller turns "ON" or "OFF" the second transistor based on a voltage of a third node between the detector element and the first resistor element, and controls the first transistor to be turned "ON" or "OFF" based on a voltage of the second node.

10. The protection circuit according to claim 9, wherein the detector element includes a plurality of diodes coupled in series.

11. The protection circuit according to claim 9, wherein the detector element includes a third transistor, a gate of the third transistor, a back-gate of the third transistor, and one end of the third transistor being coupled in common.

12. The protection circuit according to claim 9, wherein, in a case where the second transistor is turned "ON", a voltage of the second node is close to a voltage of the first power line to which the second transistor is coupled or a voltage of the second power line to which the second transistor is coupled than to an average of the voltage of the first power line and the voltage of the second power line.

13. The protection circuit according to claim 8, wherein, in a case where a power-supply voltage is applied to the first power line, the second power line is grounded, and an electric current caused by an ESD flows into the first power line, the control circuitry keeps the first transistor turned "OFF".

14. The protection circuit according to claim 13, wherein, in a case where an electric current caused by an ESD flows into the first power line in a state where a voltage is not applied to the first power line, the control circuitry turns "ON" the first transistor.

\* \* \* \* \*